United States Patent
Schellekens et al.

(10) Patent No.: US 10,153,112 B2
(45) Date of Patent: Dec. 11, 2018

(54) DEVICE FOR MONITORING THE VACUUM QUALITY OF A VACUUM CIRCUIT BREAKER

(71) Applicant: SCHNEIDER ELECTRIC INDUSTRIES SAS, Rueil-Malmaison (FR)

(72) Inventors: Hans Schellekens, Grenoble (FR); Jean-Pierre Gauthier, Grenoble (FR); Olivier Cardoletti, Grenoble (FR); Maxime Durand, Grenoble (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 2 days.

(21) Appl. No.: 15/328,727

(22) PCT Filed: Sep. 18, 2015

(86) PCT No.: PCT/EP2015/071495
§ 371 (c)(1),
(2) Date: Jan. 24, 2017

(87) PCT Pub. No.: WO2016/046091
PCT Pub. Date: Mar. 31, 2016

(65) Prior Publication Data
US 2017/0221659 A1    Aug. 3, 2017

(30) Foreign Application Priority Data

Sep. 25, 2014 (FR) ..................... 14 59067

(51) Int. Cl.
*G01R 31/00* (2006.01)
*H01H 33/668* (2006.01)
(Continued)

(52) U.S. Cl.
CPC .......... *H01H 33/668* (2013.01); *G01R 31/25* (2013.01); *H05K 1/18* (2013.01); *H02B 11/12* (2013.01); *H05K 2201/10015* (2013.01)

(58) Field of Classification Search
CPC .......... G01R 31/25; G01R 15/00; H01H 9/54; H01H 33/59; H01H 33/66; H01H 33/662;
(Continued)

(56) References Cited

U.S. PATENT DOCUMENTS

| 4,103,291 A | 7/1978 | Howe et al. |
| 4,403,124 A | 9/1983 | Perkins et al. |

(Continued)

OTHER PUBLICATIONS

International Search Report dated Apr. 20, 2016 in PCT/EP2015/071495.

*Primary Examiner* — Thang Le
(74) *Attorney, Agent, or Firm* — Oblon, McClelland, Maier & Neustadt, L.L.P.

(57) ABSTRACT

A device for monitoring vacuum quality of a vacuum circuit breaker, the device including at least one rigid assembly including a first stationary conductive surface that is separated by an insulating layer from a second stationary conductive surface that is grounded. The assembly forms a first capacitor having a fixed value, the first stationary conductive surface being arranged opposite an electrically active portion of the vacuum circuit breaker to form, together with the portion, a second capacitor, and an electronic circuit for measuring a variation in voltage of the first capacitor that is representative of a change in state of the vacuum of the circuit breaker.

9 Claims, 3 Drawing Sheets

(51) Int. Cl.
*G01R 31/25* (2006.01)
*H05K 1/18* (2006.01)
*H02B 11/12* (2006.01)

(58) Field of Classification Search
CPC ............ H01H 33/668; H01H 33/6606; H01H 33/66207; H01H 33/66261; H01H 33/66284; H01H 33/027; H01H 27/00; H05K 1/18; H05K 2201/10015; B63H 21/21; B63C 9/0005; B60K 28/04; A63B 71/00

See application file for complete search history.

(56) References Cited

U.S. PATENT DOCUMENTS

| | | | | |
|---|---|---|---|---|
| 4,547,769 A * | 10/1985 | Tanigaki | ................ | G01M 3/40 |
| | | | | 340/605 |
| 5,399,973 A | 3/1995 | Kitamura et al. | | |
| 8,658,932 B2 * | 2/2014 | Schellekens | ............ | H01H 9/54 |
| | | | | 218/122 |
| 9,870,885 B2 * | 1/2018 | Kovacich | ............ | H01H 33/668 |
| 2004/0040935 A1 * | 3/2004 | Heimbach | ............ | H01H 33/16 |
| | | | | 218/7 |
| 2008/0203062 A1 * | 8/2008 | Sato | ....................... | H01H 33/24 |
| | | | | 218/134 |

\* cited by examiner

DEVICE FOR MONITORING THE VACUUM QUALITY OF A VACUUM CIRCUIT BREAKER

TECHNICAL FIELD

The invention relates to a device for monitoring the vacuum quality of a vacuum circuit-breaker.

The invention applies more particularly, but not exclusively, to vacuum circuit-breakers, specifically of the three-phase type, which are insulated by a gas, by solid insulating materials, or by a combination of gas with an insulating partition, or are provided with outer insulation (molded-on insulation).

PRIOR ART

The monitoring of vacuum quality in vacuum bottles by the use of capacitive sensors is described, for example, in U.S. Pat. No. 4,103,291. In the device described in this document, the vacuum bottle (also called vacuum tube) incorporates a floating screen which forms a first capacitor, with a contact system which receives the mains voltage. A second capacitor is created between the floating screen of the vacuum bottle and ground. The current flowing in these two capacitors provides a measure of the vacuum state in the bottle. This mechanism is based upon the dielectric properties of a vacuum. Accordingly, in the presence of a correct vacuum, dielectric withstand will prevent the occurrence of any spark-over in the interior of the vacuum bottle, such that a capacitive current flowing in this capacitor is proportional to the mains voltage, and to the value of the said first and second series-connected capacitors. In the event of a defect in the vacuum, the dielectric withstand of the latter will be reduced, and spark-over will occur on the interior of the bottle, such that the floating screen will be brought up to the mains voltage. The first capacitor between the screen and the contacts is short-circuited, and the current flowing in the second capacitor will increase. The current in the second capacitor thus provides an indication of the vacuum quality in the bottle.

One of the disadvantages of this device is associated with its sensitivity to overvoltages in the mains system, which may result in a false alert for the loss of vacuum. Moreover, the use of a device of this type requires the presence of a floating screen on the interior of the bottle, thereby excluding its use in bottles of the "asymmetric" type, which have no floating screen.

Document EP 2463883 discloses a detector employing a plurality of capacitors for the parallel monitoring of the vacuum and of the active parts of the system up-circuit and down-circuit of the bottle. Accordingly, a deterioration in vacuum quality can be detected under all system conditions, provided that a voltage is present. In the embodiment of this detector, a solid insulator with a grounded metal screen permits the creation of substantial capacitors, in which the capacitive current is strong.

The disadvantage of the aforementioned sensors is associated with the fact that they cannot be employed in conventional circuit-breakers, either on the grounds of the absence of an appropriate measurement, or the absence of a sufficiently strong coupling to create an independent detector, in the conventional manner. Moreover, the absence of shielded insulation dictates the observation of a substantial clearance to the bottle.

FIG. 1 shows a schematic illustration of the principle of a device for monitoring the quality of a vacuum in a vacuum bottle 1 of a circuit-breaker according to the prior art. The number 8 indicates a wall of the vacuum bottle 1. This device has a first conductive surface 4, arranged between a metal screen 18 which constitutes an electrically live element of the vacuum bottle 1, and a second conductive surface 10, mounted in a moveable arrangement on a truck 12, which is connected to ground T. The first conductive surface 4 forms a capacitor comprised of two series-connected capacitors, namely, a "vacuum" capacitor 14 formed between the electrodes 16 of the vacuum bottle 1 and the metal screen 18 surrounding the electrodes 16, and a capacitor 34 formed between the conductive surface 4 and the outer face of the metal screen 18 which is arranged opposite the latter. The conductive surface 4 also forms a further capacitor 32, in combination with the second conductive surface 10.

The value of the capacitor 14 is clearly defined, and is dependent upon the design of the vacuum circuit-breaker. Conversely, the values of the capacitors 32 and 34 are dependent upon the distances D1 and D2 which separate the conductive surface 4 respectively from the metal screen 18 and the second conductive surface 10. In this device, the transient voltage measured on the conductive surface 4 is dependent upon the values of the capacitors 14, 32 and 34, and of the line voltage $V_{HV}$ on the electrodes 16. As the value of the capacitor 14 is much greater than that of the capacitors 32 and 34, the greater part of the voltage $V_{HV}$ is applied to the capacitors 32 and 34.

The distribution of the voltage $V_4$ over the conductive surface 4 in relation to the line voltage $V_{HV}$ will be proportional to the distances D1 and D2. The capacitors 32 and 34 may be considered as the product of parallel plate condensers. In consequence, the value of the capacitor 32 is inversely proportional to the distance D1, and that of the capacitor 34 is inversely proportional to the distance D2. As the value of the capacitor 14 is much greater than that of the capacitor 32, it can be ignored in the approximation. As a result, the voltage $V_4$ on the conductive surface 4 is dependent upon the ratio D2/(D1+D2) and upon the high voltage $V_{HV}$ on the electrodes in the interior of the vacuum circuit-breaker:

$$V_4 \sim \frac{D2}{D1+D2} * V_{HV}$$

In order to understand the consequences of this relationship, the following realistic condition is considered: in a standard medium-voltage vacuum circuit-breaker, the distance between the vacuum circuit-breaker and the circuit-breaker truck (D1+D2) is generally 10 cm. The voltage $V_{HV}$ is typically 10 kV. In order to obtain an entirely safe operating voltage on the conductive surface 4, of a value below 48 volts, the distance D2 must be 0.5 mm from the grounding plate 10 on the truck 12 of the circuit-breaker. A variation of 5 mm in the distance D2 will result in a voltage of 500 V on the conductive surface 4, exceeding the permissible voltage level on a low-voltage measuring device by a factor of 10. Clearly, it is difficult to maintain D2 at a safe distance of 0.5 mm under practical working conditions.

The absence of the effective control of the distances D1 and D2 and/or of the capacitors 32 and 34 jeopardizes the measurement and the electronic circuit as follows:

If the distance D2 between the conductive surface 4 and the circuit-breaker truck 12 is too small, the transient voltage will be low, and excessively difficult to detect.

This does not permit the detection of a loss of vacuum in the vacuum circuit-breaker bottle.

If this distance is too great, the voltage $V_4$ on the conductive surface 4 will become excessively high, which may cause damage to electronic components or create a short-circuit in the instrument circuit. This distance will be affected by the manner in which the conductive surface 4 is fitted to the truck 12.

One object of the invention is to rectify the aforementioned disadvantages of the prior art.

More specifically, the object of the invention is the disclosure of a device for the detection of a defect in the vacuum of a circuit-breaker vacuum bottle, involving no physical contact between the live parts of the circuit-breaker.

DESCRIPTION OF THE INVENTION

The object of the invention is fulfilled by a device for monitoring the vacuum quality of a vacuum circuit-breaker, having a first stationary conductive surface that is separated by an insulating layer from a second stationary conductive surface, thus forming a first capacitor having a fixed value, and an electronic circuit for measuring a variation in the voltage on said first capacitor that is representative of a change in state of the vacuum of the circuit-breaker. According to a further characteristic of the invention, said first stationary conductive surface forms a second fixed capacitor, in combination with an electrically active element of the vacuum circuit-breaker.

According to a further characteristic of the invention, the rigid assembly is arranged on the interior of a cylindrical electric shielding, at least one exterior surface of which forms a second fixed capacitor, in combination with ground.

The insulating layer is formed either by a honeycomb structure, or by a foam structure, or by an epoxy resin plate.

In a first form of embodiment of the device according to the invention, the rigid assembly is formed on a printed circuit board, onto which the first conductive surface and the second conductive surface are etched, separated by an insulator.

In a first variant of this form of embodiment, the rigid assembly is mounted on a moveable truck which is connected to ground.

In a second variant, the rigid assembly is arranged on the interior of a cylindrical electric shielding which surrounds the vacuum circuit-breaker, wherein said shielding is conducted to the second conductive surface, wherein said first conductive surface is connected to a metal screen forming said electrically active element of the vacuum bottle, and the second capacitor is formed between the exterior surface of the electric shielding and ground.

In a further variant, the rigid assembly may be attached to the external surface of the vacuum bottle in the form of a "patch", in electrical contact with said electrically active element.

The device according to the invention permits the monitoring of the vacuum quality of a three-phase vacuum circuit-breaker. In this case, for each phase, the device incorporates said rigid assembly. The latter also comprises an additional capacitor, which is arranged for the recovery of an electric current for the supply of the electronic circuit which is designed to detect a change in state of the vacuum.

BRIEF DESCRIPTION OF THE DRAWINGS

Further characteristics and advantages of the invention will be identified from the following description, which is provided by way of an example and not by way of limitation, with reference to the attached figures, in which.

DETAILED DESCRIPTION OF SPECIFIC FORMS OF EMBODIMENT

Figure 1:
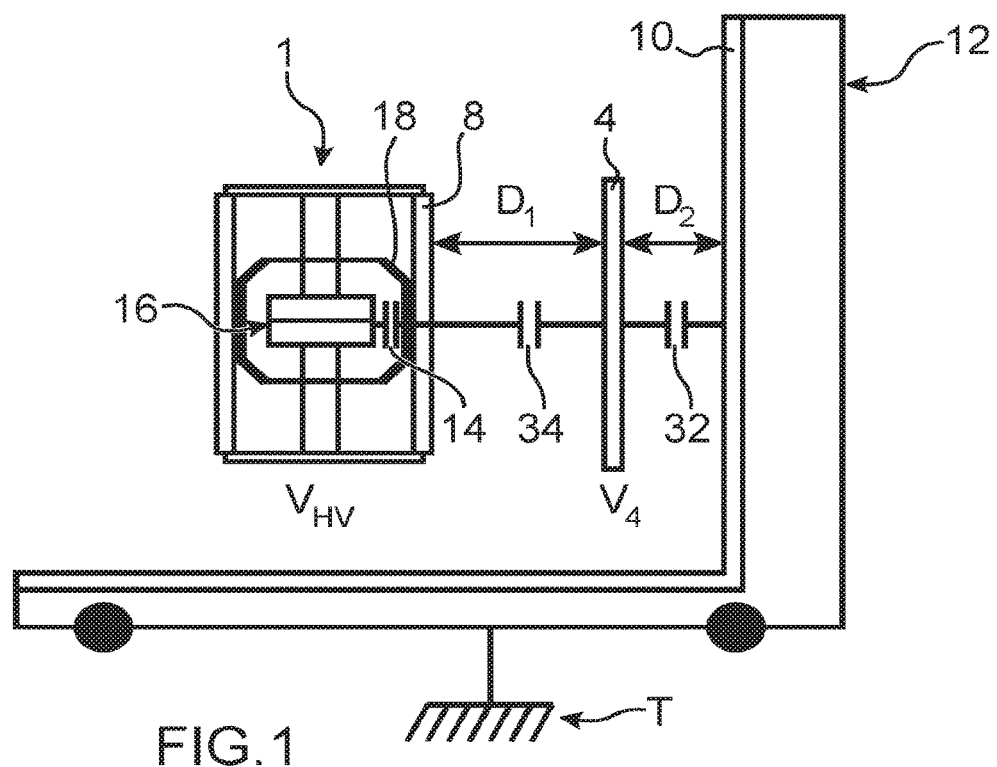
FIG. 1, as described above, shows a schematic illustration of the principle of a device for monitoring the quality of a vacuum in a vacuum circuit-breaker according to the prior art.

In the interests of clarity, identical reference symbols will be used to designate elements of the device according to the prior art shown in FIG. 1, and of the devices according to the invention.

Figure 2:
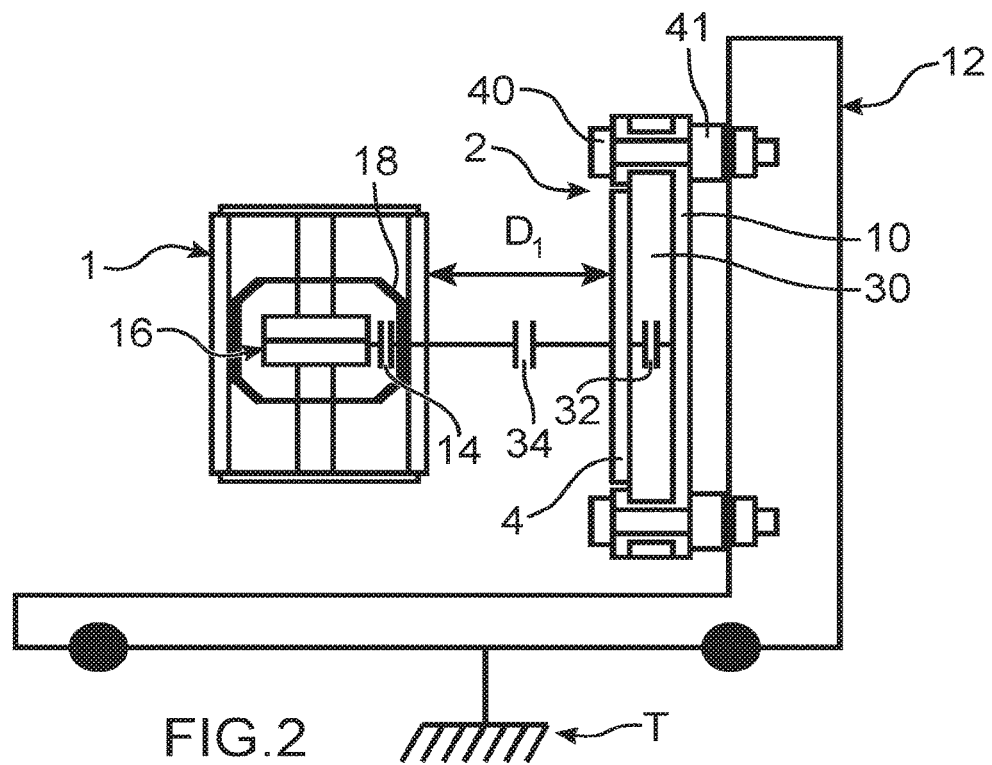
FIG. 2 shows a schematic illustration of a first form of embodiment of a device for monitoring the quality of a vacuum in a vacuum circuit-breaker according to the invention.

FIG. 2 shows a schematic illustration of a vacuum circuit-breaker comprising a truck 12 and at least one vacuum bottle 1, and a rigid assembly 2 forming a detector for variations in the state of the vacuum in the bottle 1. This detector comprises a first stationary conductive surface 4, separated by an insulating layer 30 from a second stationary conductive surface 10 which is connected to ground T. The rigid assembly 2 comprised of the first stationary conductive surface 4 and the second stationary conductive surface 10 form a first capacitor 32 having a fixed value (or set value). The rigid assembly thus formed is mounted on the truck 12, and is arranged such that the first stationary conductive surface 4 is arranged opposite an electrically active element 18 of the vacuum circuit-breaker. The first conductive surface 4 thus forms a second capacitor 34, in combination with this electrically active element 18. An electronic circuit, which is not represented, is connected to the rigid assembly 2 for the measurement of current variations in the first capacitor 32 and the second capacitor 34, and for the delivery of an indication of the state of vacuum in the bottle 1, as a function of the result of measurements.

The connection to ground of the second stationary conductive surface 10 is executed in the form of a bolt or a rivet 40 which secures the insulating layer 30 and forms a rigid connection to the truck 12. A spacer element 41 attached to the bolt 40 permits the maintenance of a sufficient clearance between the rigid assembly 2 and the electronic components mounted on the detection circuit which is installed on the truck 12. As a result of the rigidity of the assembly thus formed, the capacitor 32 has a fixed value. The thickness of the insulating layer 30 ranges from 0.1 to 10 mm. An excessively low value results in an excessive increase in the value of the capacitor 32, and inappropriately reduces the transient voltage measured on the first stationary conductive surface 4.

Figure 3:
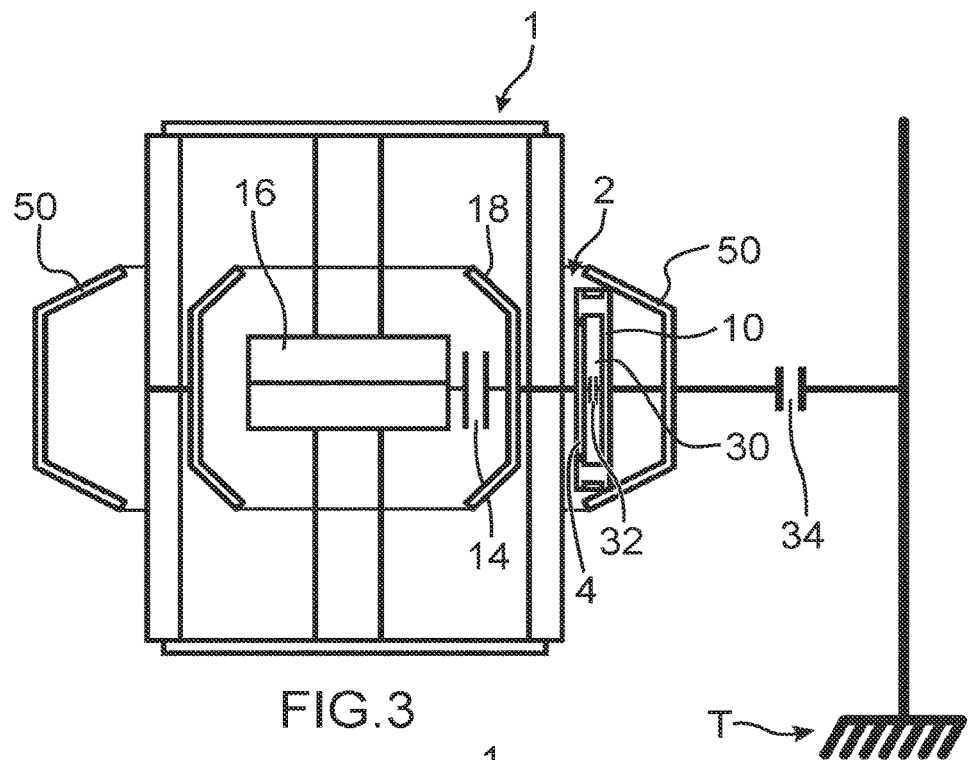
FIG. 3 shows a schematic illustration of a second form of embodiment of a device for monitoring the quality of a vacuum in a vacuum circuit-breaker according to the invention.

FIG. 3 illustrates a second form of embodiment of the invention, in which the rigid assembly 2 is arranged on the interior of a cylindrical electrical shielding 50 which encloses the vacuum bottle 1. Said shielding is connected to the second conductive surface 10, and the first conductive surface 4 is connected to the electrically active element 18 of the vacuum bottle. The second capacitor 34 is formed between the exterior surface of the electric shielding 50 and ground.

Figure 4:
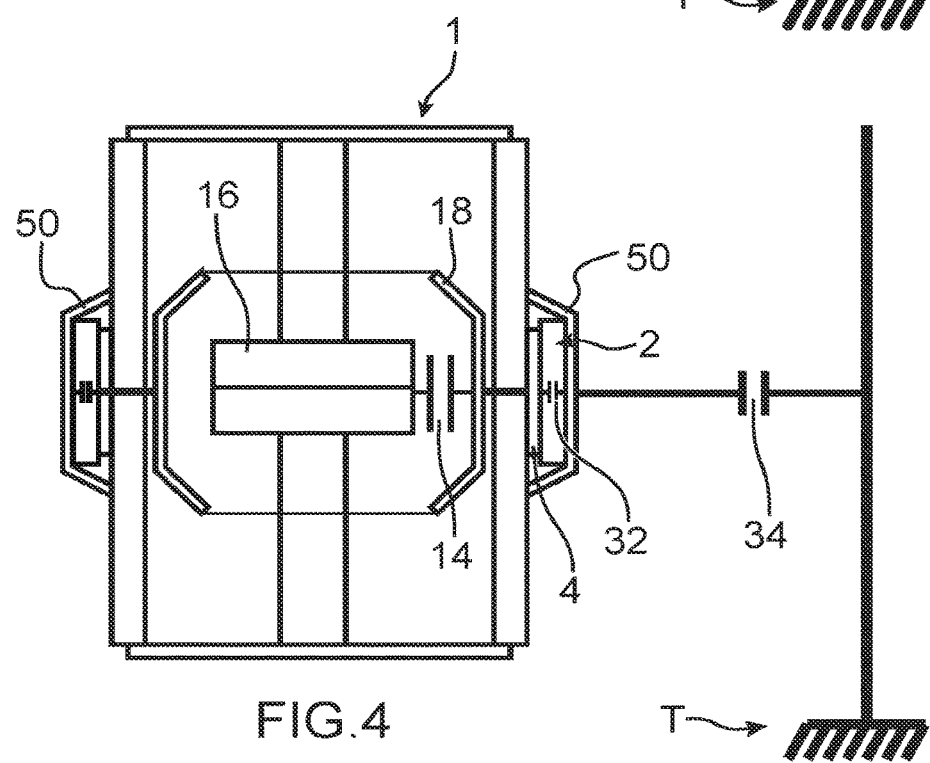
FIG. 4 shows a schematic illustration of a third form of embodiment of a device for monitoring the quality of a vacuum in a vacuum circuit-breaker according to the invention.

The assembly thus formed can be fitted to the external surface of the vacuum bottle 1, around the metal screen 18, in the form of a "patch", as illustrated in FIG. 4. The conductive surface 4 is in direct electrical contact with the electrically active element 18.

As a result of the direct contact with the metal screen 18, the system can be self-powered.

In operation, the voltage of the first capacitor 32 $V_{32}$ is used to monitor the state of the vacuum in the vacuum circuit-breaker. In the case of a vacuum circuit-breaker with a good level of vacuum, the string of capacitors 14, 32 and 34 permits the determination of the current flowing in said capacitors, and the deduction therefrom of the voltage $V_{32}$, using the following formula:

$$V_{32} = \frac{1/C_{32}}{\left(\frac{1}{C_{14}} + \frac{1}{C_{34}} + \frac{1}{C_{32}}\right)} * V_{HV}$$

Figure 5:
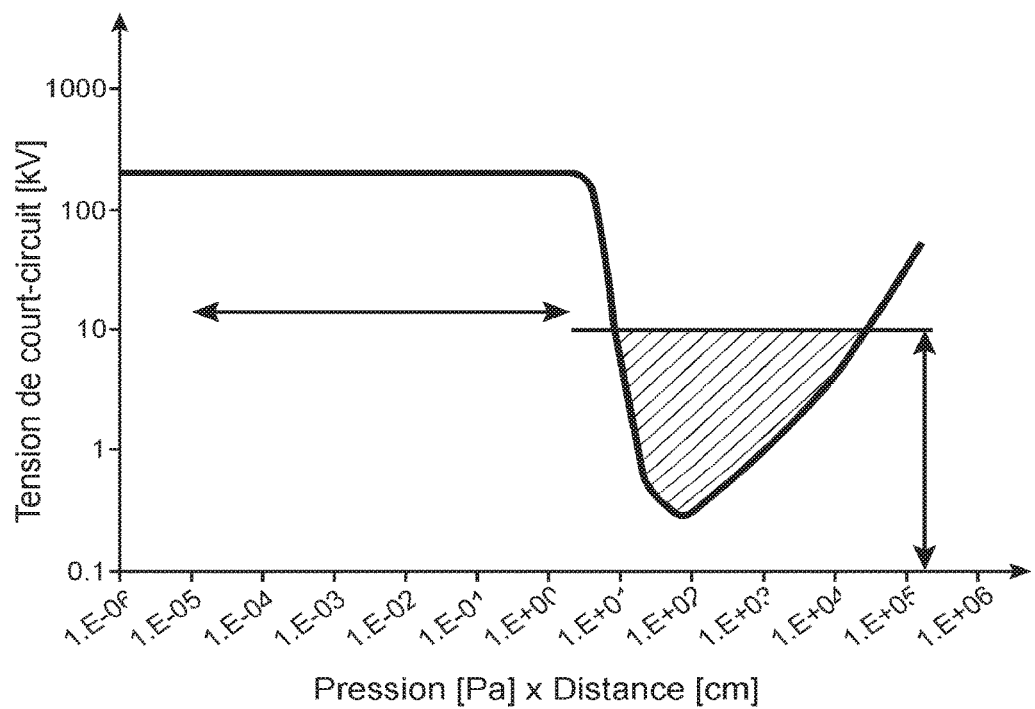
FIG. 5 shows a curve illustrating the variation in the dielectric withstand voltage of an industrial vacuum circuit-breaker.

In the case of a circuit-breaker with a vacuum defect, the pressure in the vacuum bottle of the circuit-breaker will increase steadily, and the dielectric withstand of the circuit-breaker observes Paschen's law, as illustrated in FIG. 5.

Where the level of vacuum in the circuit-breaker achieves a value described as the "Paschen minimum", the dielectric withstand will be lower than the system voltage. This results in short-circuits between the electrodes 16 and the metal screen 18. The capacitor 14 is thus short-circuited, resulting in an increase in the current flowing in the remaining capacitors 32 and 34 in the string. The voltage $V_{32}$ thus varies as follows:

$$V_{32} = \frac{1/C_{32}}{\left(\frac{1}{C_{32}} + \frac{1}{C_{34}}\right)} * V_{HV}$$

As a result, the voltage V32 increases in the presence of a defect in the vacuum in the vacuum bottle 1.

The invention claimed is:

1. A device for monitoring vacuum quality of a vacuum circuit-breaker, comprising:
   at least one rigid assembly comprising a first stationary conductive surface that is separated by an insulating layer from a second stationary conductive surface to form a first capacitor having a fixed value; and
   an electronic circuit configured to measure a variation in a voltage on the first capacitor that is representative of a change in state of the vacuum of the circuit-breaker, wherein the first stationary conductive surface forms a second fixed capacitor in combination with an electrically active element of the vacuum circuit-breaker.

2. The device as claimed in claim 1, wherein the insulating layer is formed by a honeycomb structure.

3. The device as claimed in claim 1, wherein the insulating layer is formed by a foam structure.

4. The device as claimed in claim 1, wherein the insulating layer is formed by an epoxy resin plate.

5. The device as claimed in claim 1, wherein the rigid assembly is mounted on a moveable truck which is connected to ground.

6. The device as claimed in claim 1, wherein the rigid assembly is attached to the external surface of a vacuum bottle of the vacuum circuit-breaker in a form of a patch, in electrical contact with the electrically active element.

7. A device for monitoring vacuum quality of a three-phase vacuum circuit-breaker, comprising, for each phase, a rigid assembly as claimed in claim 1, and each rigid assembly further comprises an additional capacitor, arranged for recovery of a current for supply of the electronic circuit configured to detect a change in state of the vacuum.

8. A device for monitoring vacuum quality of a vacuum circuit-breaker, comprising:
   at least one rigid assembly comprising a first stationary conductive surface that is separated by an insulating layer from a second stationary conductive surface to form a first capacitor having a fixed value; and
   an electronic circuit configured to measure a variation in a voltage on the first capacitor that is representative of a change in state of the vacuum of the circuit-breaker, wherein the rigid assembly is arranged on an interior of a cylindrical electric shielding, at least one exterior surface of which forms a second fixed capacitor, in combination with ground.

9. A device for monitoring vacuum quality of a vacuum circuit-breaker, comprising:
   at least one rigid assembly comprising a first stationary conductive surface that is separated by an insulating layer from a second stationary conductive surface to form a first capacitor having a fixed value; and
   an electronic circuit configured to measure a variation in a voltage on the first capacitor that is representative of a change in state of the vacuum of the circuit-breaker, wherein the rigid assembly is formed on a printed circuit board, onto which the first conductive surface and the second conductive surface are etched, separated by the insulating layer.

* * * * *